US012018362B2

(12) United States Patent
Man et al.

(10) Patent No.: US 12,018,362 B2
(45) Date of Patent: Jun. 25, 2024

(54) SINGAPORE DIAMOND PREPARATION METHOD

(71) Applicant: SHANGHAI ZHENGSHI TECHNOLOGY CO., LTD., Shanghai (CN)

(72) Inventors: Weidong Man, Shanghai (CN); Changzheng Zhu, Shanghai (CN); Chuang Gong, Shanghai (CN); Jianbo Wu, Shanghai (CN); Jianhong Jiang, Shanghai (CN)

(73) Assignee: SHANGHAI ZHENGSHI TECHNOLOGY CO., LTD., Shanghai (CN)

( * ) Notice: Subject to any disclaimer, the term of this patent is extended or adjusted under 35 U.S.C. 154(b) by 574 days.

(21) Appl. No.: 17/292,001

(22) PCT Filed: Feb. 5, 2021

(86) PCT No.: PCT/CN2021/075505
§ 371 (c)(1),
(2) Date: May 6, 2021

(87) PCT Pub. No.: WO2022/095301
PCT Pub. Date: May 12, 2022

(65) Prior Publication Data
US 2022/0364224 A1 Nov. 17, 2022

(30) Foreign Application Priority Data

Nov. 6, 2020 (CN) .......................... 202011229600.7

(51) Int. Cl.
*C23C 16/27* (2006.01)
*C23C 16/02* (2006.01)
*C23C 16/511* (2006.01)
*H01L 29/16* (2006.01)

(52) U.S. Cl.
CPC ........ *C23C 16/271* (2013.01); *C23C 16/0245* (2013.01); *C23C 16/0254* (2013.01); *C23C 16/511* (2013.01); *H01L 29/1602* (2013.01)

(58) Field of Classification Search
CPC ... C23C 16/27; C23C 16/271; C23C 16/0245; C23C 16/0254
See application file for complete search history.

(56) References Cited

U.S. PATENT DOCUMENTS

| 5,314,540 A * | 5/1994 | Nakamura | ............ C23C 16/276 118/723 R |
| 5,547,716 A * | 8/1996 | Thaler | ................. C23C 16/0245 427/586 |
| 6,544,599 B1 * | 4/2003 | Brown | ................... C23C 4/123 427/383.1 |
| 9,981,317 B2 * | 5/2018 | McClymont | ............ C30B 29/04 |
| 2016/0053366 A1 * | 2/2016 | Stowell | ................ C23C 16/272 204/192.15 |

FOREIGN PATENT DOCUMENTS

| CN | 1132267 A | | 10/1996 | |
| CN | 1900356 A | | 1/2007 | |
| CN | 104561925 A | | 4/2015 | |
| CN | 108374160 A | | 8/2018 | |
| CN | 109911894 A | | 6/2019 | |
| CN | 110565064 A | | 12/2019 | |
| CN | 111321389 A | | 6/2020 | |
| CN | 112030133 B | * | 3/2021 | ............. C23C 16/27 |
| KR | 1991-0012791 | * | 9/1991 | ............. C23C 16/26 |
| WO | WO 9426952 A1 | * | 11/1994 | ............. C23C 16/02 |

OTHER PUBLICATIONS

Mandal, Soumen, "Nucleation of diamond films on heterogeneous substrates: a review". RSC Adv., 2021, 11, 10159-10182.*
Gebbie, Matthew A., et al., "Experimental measurement of the diamond nucleation landscape reveals classical and nonclassical features". PNAS, vol. 115, No. 33, Aug. 14, 2018, 8284-8289.*
Hormann, F., et al., "First stages of diamond nucleation on iridium buffer layers". Diamond and Related Materials, 10 (2001) 1617-1621.*
Lee, S.-Tong, et al., "CVD diamond films: nucleation and growth". Materials Science and Engineering, 25 (1999) 123-154.*
Mandal, Soumen, et al., "Chemical Nucleation of Diamond Films". Applied Materials & Interfaces, 2016, 8, 26220-26225.*
Monteiro, Othon, et al., "Nucleation and growth of CVD diamond films on patterned substrates". Diamond and Related Materials, 12 (2003) 1357-1361.*
Jackman, Richard B., et al., "The growth of nucleation layers for high-quality diamond CVD from an r.f. plasma". Diamnd and Related Materials, vol. 4, Issues 5-6, May 1, 1995, pp. 735-739.*
Modern thin film materials and technology, Editor: Zhang, Yonghong, Northwestern Polytechnical University Press, pp. 186-193, Aug. 31, 2016, ISBN 078-7-5612-5003-7.
Practice book of new technology and application in design, production and processing of film products, Editor: Li, Qingnian, pp. 319-326, vol. 1, Apr. 30, 2004, Yinshen Audiovisual Press, ISBN 7-88362-568-8.
Hard materials and tools, Editor: Zhou, Shuzhu, Metallurgical Industry Press, pp. 342-343, Aug. 31, 2015, ISBN 978-7-5024-6955-9.

* cited by examiner

*Primary Examiner* — Bret P Chen
(74) *Attorney, Agent, or Firm* — SOROKER AGMON NORDMAN PTE LTD

(57) ABSTRACT

A method for preparing a diamond is disclosed. The method includes: processing a substrate material of a substrate holder to obtain a surface that is easily separated from diamond films, using a plasma chemical vapor deposition method to form a diamond film layer on the surface of the substrate holder, the plasma chemical vapor deposition method using multi-energy source coupled plasma and, post-processing the diamond film layer to remove impurity material on the diamond surface and a nucleation layer and/or stress layer with inconsistent properties of a main body of the diamond film. The method has the advantages of controllable thickness, controllable quality, controllable cost, etc., and lays the foundation for diamond in the fields of cutting tools and heat sinks.

17 Claims, 4 Drawing Sheets

SINGAPORE DIAMOND PREPARATION METHOD

RELATED APPLICATIONS

The present application claims priority to PCT application PCT/CN2021/075505 filed on Feb. 5, 2021, which claims priority from Chinese Patent Application No. CN202011229600.7 filed on Nov. 6, 2020. These applications are referred to and incorporated herein in their entireties by reference.

TECHNICAL FIELD OF THE INVENTION

The present disclosure relates to the field of preparation of superhard materials, and specifically relates to a preparation method for a high-quality diamond.

BACKGROUND OF THE INVENTION

Diamonds have many excellent properties, such as the highest hardness, the best wear resistance, etc., which makes diamonds have a wide range of uses in many aspects. At present, the main preparation methods include high-temperature and high-pressure method, explosion method, chemical vapor deposition method and so on. The explosion method can only produce powder, while the conditions for the high-temperature and high-pressure method are relatively harsh, and the purity of the prepared diamond is low. With the development of technology, the application of plasma chemical vapor deposition method is becoming widerly, and can be used to prepare diamond coating tools, crystal diamond, free standing optical window, etc., and the main industrial methods include hot filament, microwave, arc torch, magnetron sputtering, etc. With the progress went on, people have found some usage problems, such as the hot filament method is low cost, but the quality of the diamond is not high, while the microwave method is of high quality, but the equipment is complicated, and it is difficult to scale up production and costs; the arc torch method can produce high-quality single crystal optical-grade diamond, but the internal stress of the diamond is relatively high, the cost is relatively high, and the product is less than 80%. People have adopted various methods, such as temperature field simulation, flow field simulation, plasma emission spectrum test, stress field simulation & test, etc. People have approached the limitation with a single method, but the result is still not very well.

Shanghai Zhang Zhiming groups introduced bias voltage hot filament plasma technology, which greatly enlarged the deposition parameters, and approach a great application on wire drawing dies area. Beijing and Shijiazhuang Lv Fanxiu groups introduced the magnetic to the arc torch, which lead to greatly improvement on temperature gradient of the torch, thereby reducing the stress of prepared diamond thick films, and improving the yield. However, the above-mentioned methods are still difficult to apply chemical vapor deposition diamond technology on industrial application, and the uniformity, toughness, internal stress, service life, diamond quality, etc. of the prepared diamond still need to be improved.

SUMMARY OF THE INVENTION

The present disclosure is intended to overcome the deficiencies of the prior art, and to provide an improved preparation method for diamond, which can stably obtain high-quality diamonds.

The present disclosure further provides a diamond prepared according to the above-mentioned method at the same time.

The present disclosure further provides use of the diamond prepared above-mentioned in the preparation of cutting tools and heat sinks at the same time.

To achieve the above purposes, a technical solution employed the present disclosure is:

a method for preparing diamond, comprises the following steps in sequence:

(1) processing a substrate material of a substrate holder to obtain a surface that is easily separated from diamond films, wherein the substrate material of the substrate holder is processed in any of the following ways:

Way I: using a first material as the substrate material, performing surface polished processing, and forming a first nucleation layer on a surface of the substrate material to obtain the substrate holder, the first material being a material that does not react with carbon at the vapor deposition temperature of diamond, and the material of the first nucleation layer is selected from diamond, amorphous carbon, silicon carbide, silicon, germanium, beryllium, and combinations thereof;

Way II: using a second material as the substrate material, performing surface polished processing, and forming a second nucleation layer to obtain the substrate holder, the second material being a material that softens or melts at the vapor deposition temperature of diamond, and the material of the second nucleation layer is selected from carbon, silicon, silicon carbide, silicon nitride, and combinations thereof;

Way III: processing the surface of the substrate material and forming a loose layer and a third nucleation layer thereon in sequence to serve as the substrate holder, a material of the loose layer is selected from amorphous carbon, amorphous silicon, diamond micro-powder, silica micro-powder, aluminum oxide micro-powder, and combinations thereof; a material of the third nucleation layer is selected from diamond, amorphous carbon, silicon carbide, silicon, germanium, beryllium, and combinations thereof;

(2) using a plasma chemical vapor deposition method to form a diamond film layer on the surface of the substrate holder, wherein the plasma chemical vapor deposition method uses a multi-energy sources to couple with plasma, and the plurality of energy sources are 2, 3, or more kinds;

(3) post-processing the diamond film layer to remove impurity material on the diamond surface and a nucleation layer and/or stress layer with inconsistent properties of a main body of the diamond film.

Further, in Way I, the first material may be specifically selected from materials that do not react with carbon, such as copper, copper alloy, silicon carbide, aluminum oxide, silicon dioxide, and microcrystalline glass ceramics.

In Way II, the second material may be selected from mercury, plumbum, tin, aluminum, sodium, and alloys thereof, etc.

In Way III, the substrate material is not particularly limited, and may be any suitable material, specifically, it may be selected from those materials that react with diamond at the vapor deposition temperature of diamond, or may be selected from the first material and the second material mentioned above.

As a preferred implementation of the present disclosure, in Way III, the substrate material is selected from those materials that react with diamond at the vapor deposition temperature of diamond, specifically, for example, iron, iron alloy, nickel, nickel alloy, titanium, tungsten, molybdenum and alloys thereof, etc.

Further, in Way I, the first nucleation layer may have a thickness of 5 nm-5 µm, and the existence of the first nucleation layer is very helpful for the growth of diamond in the subsequent steps and greatly improves its growth efficiency. The nucleation density of the first nucleation layer is not particularly limited, but from an industrial point of view, it is preferably not lower than $1.0 \times 10^{13}$ per $cm^2$. The thickness of the first nucleation layer may more preferably be 50 nm-500 nm.

Further, in Way II, the second nucleation layer has a thickness of 200 nm-5 µm, and the provision of the second nucleation layer can effectively ensure the overall structure and integrity of the finally formed and separated diamond film. The nucleation density of the second nucleation layer is also not particularly limited, but from an industrial point of view, it is preferably not lower than $1.0 \times 10^{13}$ per $cm^2$. The thickness of the second nucleation layer may more preferably be 500 nm-5 µm, and even more preferably be 1-5 µm.

Further, in Way III, the loose layer has a thickness of 0.01 nm-1000 µm, and the function of the loose layer is to facilitate the separation of the formed diamond film from the substrate holder and at the same time facilitate the diamond nucleation, in terms of its function, there is no special requirement for its specific thickness if it is suitable for practical industrial production. The substrate holder adopting Way III is particularly suitable for obtaining a self-supporting diamond thick film with perfect crystal form. The material of the loose layer is not limited to those mentioned above, and may also be other materials having a crystal structure similar to that of diamond.

Further, the loose layer may be a loose layer in the initial stage, or it may be formed by vaporized and decomposed during the diamond deposition process.

Further, in Way III, the third nucleation layer has the same function as the first nucleation layer, which is to promote the deposition and growth of diamond, and its thickness may be 0.1 nm-100 µm, and the nucleation density is not lower than $1 \times 10^{13}$ per $cm^2$.

Further, the loose layer can be prepared using processes known in the art such as chemical vapor deposition, thermal deposition, spin coating, or Czochralski method. The first nucleation layer, the second nucleation layer, and the third nucleation layer may be respectively formed using a chemical vapor deposition method.

Further, in Step (1), the surface of the substrate holder is a nano-level plane, a micron-level plane or a millimeter-level plane. Specifically, the surface finish of the nano-level plane is 0.1-1000 nm, the surface finish of the micron-level plane is 0.1-1000 µm, and the surface finish of the millimeter-level plane is 0.1-1000 mm. Further preferably, the surface finish of the nano-level plane is 0.1-500 nm, the surface finish of the micron-level plane is 10-800 µm, and the surface finish of the millimeter-level plane is 1-1000 mm. Still further preferably, the surface finish of the nano-level plane is 1-500 nm, the surface finish of the micron-level plane is 50-800 µm, and the surface finish of the millimeter-level plane is 100-1000 mm. Wherein, as a preference, the surface of the substrate holder is a nano-level plane.

Further, in Step (2), in the plasma chemical vapor deposition method, the temperature of the substrate holder is preferably from room temperature to 1200° C., further preferably 500-1200° C., and still further preferably 800-1000° C. The deposition pressure is generally 0.01 to 200 kPa, preferably 0.1 to 20 kPa, further preferably 1 to 10 kPa, and still further preferably 2 to kPa. The speed of depositing diamond may be controlled between 0.01-1000 µm/h, but from the perspective of ensuring the quality of diamond, preferably, the speed is controlled to 0.01-200 µm/h, and further preferably, the speed is controlled to 0.1-100 µm/h. Still further preferably, the speed is controlled to 1-50 µm/h.

Further, in the plasma chemical vapor deposition method, the deposition gas is a mixture of an etching gas, a diamond carbon source gas, an assisted deposition or doping gas.

Further preferably, in Step (2), the etching gas is selected from hydrogen, ammonia, fluorine, hydrogen fluoride, hydrogen chloride, and combinations thereof, and the diamond carbon source gas is selected from methane, acetone, acetylene, and combinations thereof.

Further preferably, in Step (2), the assisted deposition or doping gas is selected from nitrogen, argon, xenon, borane, silane, phosphorane, and combinations thereof.

Further preferably, a purity of each gas in the deposition gas is not less than 99.9999%.

According to a preferred aspect of the present disclosure, in Step (2), the energy sources are selected from magnetic resonance, electric arc, hot filament, flame, microwave, radio frequency, high frequency, direct current, laser, ion beam, electron beam, electron cyclotron resonance, and also meet the following (i) or (ii):
  (i) the plurality of energy sources comprises at least magnetic resonance, and the energy of the plasma in the diamond deposition area is equalized through a coupling of the plurality of energy sources;
  (ii) the plurality of energy sources does not comprise magnetic resonance, when performing the plasma chemical vapor deposition, magnetic confinement is applied to shield more than 99.9% of energy ions above 5 keV from the diamond deposition area;

Through the coupling of the plurality of energy sources, the plasma density in the diamond deposition area is controlled to be $(0.1\text{-}100) \times 10^{10}$ per $cm^3$.

Further, the electric arc may be a cathode arc or an arc torch.

Further and preferably, the coupling of the plurality of energy sources adopts one of the following coupling modes:
  Mode A: the coupling of the plurality of energy sources is the coupling of laser and/or microwave, cathode arc, electron cyclotron resonance;
  Mode B: the coupling of the plurality of energy sources is the coupling of arc torch, magnetic resonance and electron cyclotron resonance;
  Mode C: the coupling of the plurality of energy sources is the coupling of magnetic resonance, hot filament and direct current;
  Mode D: the coupling of the plurality of energy sources is the coupling of magnetic resonance, hot filament and high frequency;
  wherein, at the time Mode A is adopted, a magnetic confinement is applied.

According to a specific and preferred aspect of the present disclosure, in Mode A, the laser and/or microwave are first coupled with the cathode arc to smoothly initiate the cathode arc sustainably and stably generate the cathode arc, and after the generated plasma excited by the cathode arc passes through the magnetic confinement to shield high-energy ions (ions with energy higher than 5 keV), it couples with the electron cyclotron resonance plasma.

According to another specific and preferred aspect of the present disclosure, in Mode B, the plasma generated by the arc torch is first coupled with the magnetic resonance plasma, and through the coupling, at a position of 10-15 mm from the arc torch mouth, a temperature gradient from a torch core to a torch edge is 40 to 50 degrees Celsius/mm. The internal thermal stress of the formed diamond film layer is less than 200 MPa. Compared with using a single arc torch (the temperature gradient from the torch core to the torch edge is 400-500 degrees Celsius/mm, the thermal stress inside the prepared diamond is above 1 G, and the growth area of the diamond is only a tube conical area of 3-5 mm from the arc edge), the effect of coupling is very significant.

According to still another specific and preferred aspect of the present disclosure, in Mode C, the diamond deposition rate may reach 40-50 μm/h through coupling, and the hardness of the obtained diamond film reaches 80-100 GPa.

Preferably, the plasma density in the diamond deposition area is $0.1 \times 10^{10}$-$10 \times 10^{10}$ per $cm^3$, and further preferably, the plasma density in the diamond deposition area is $0.1 \times 10^{10}$-$1 \times 10^{10}$ per $cm^3$.

According to yet another particularly preferred and specific aspect of the present disclosure, in Mode C, through coupling, a diamond deposition area with a distance of 5-100 mm from the hot filament is obtained (while only the hot filament is used as an energy source, the effective diamond deposition area is a tubular area of 3-5 mm from the hot filament).

According to still another particularly preferred and specific aspect of the present disclosure, in Mode D, when the diamond deposition rate reaches 40-50 μm/h through coupling, the hardness of the obtained diamond film reaches 80-100 GPa. With a single energy source or a simple superposition of a plurality of energy sources, the hardness of the obtained diamond can only reach 30-70 GPa when the deposition rate is 2-5 μm/h. If the deposition rate is further increased, the hardness of the diamond will further decrease.

Preferably, in Step (2), the environment or conditions of chemical vapor deposition are balance controlled, and the environment or conditions are one or more of deposition temperature, deposition voltage, deposition current, deposition power, deposition gas pressure, and deposition gas flow rate. The specific control method can be conventional means known in the art. Further, when a photoelectric self-feedback control system is used to perform the balance control, the photoelectric self-feedback control system comprises a temperature measurement and control system, a voltage self-feedback control system, a current self-feedback control system, a power self-feedback control system, and an emission spectrum self-feedback control system, and through the control of the photoelectric self-feedback control system, the deposition temperature deviation is not higher than 0.5° C., the deposition voltage deviation is not higher than 0.5 V the deposition current deviation is not higher than 0.5 A, the deposition power deviation is not higher than 10 W, the deposition gas pressure deviation is not higher than 50 Pa, and the deposition gas flow deviation is not higher than 0.5 sccm.

Further, by using high thermal conductivity copper and the like for the preparation of the substrate holder, the temperature difference range of the substrate holder is controlled to be less than 0.5° C., and materials with different thermal conduction rates are padded between the substrate holder and a heat dissipation water-cooling cavity, such as graphite, copper, stainless steel, and foamed alumina, to control the thermal conduction rate, the temperature gradient of the base of the substrate holder, and the cooling rate, to improve the quality of diamond deposition, and to reduce the temperature difference stress of diamond.

In Step (2), it is also preferable to control the temperature gradient and the energy transfer direction of the temperature field in the diamond deposition area to control the deposition of diamond, as desired.

In a specific and preferred manner according to the present disclosure, in Step (3), the post-processing preferably comprises chemical processing, plasma etching, cutting, grinding and polishing carried out in sequence.

In another embodiment according to the present disclosure, in Step (3), the post-processing comprises cutting and grinding and polishing carried out in sequence.

Further, in Step (3), the chemical processing is processing with an organic acid and/or an inorganic acid, or a combination thereof with hydrogen peroxide;

In Step (3), the cutting is laser cutting, the laser has a wavelength of 100-1100 nm, a laser power of 0.1-100 kW, and a repetition rate of 0.1-99.9%, and the surface roughness after cutting is 0.1 nm-100 μm; wherein, the laser cutting is pulsed laser cutting, when used for cutting diamond, by controlling the overlap rate between the spots generated by two adjacent pulsed lasers, and combined with the control of the laser spot diameter, it can be realized that the diamond after processed can achieve the desired ideal surface finish, therefore, the aforementioned "repetition rate of 0.1-99.9%" means that the overlap rate between the spots generated by two adjacent pulsed lasers is 0.1-99.9%.

In Step (3), the grinding and polishing is mechanical grinding. Further, a gyration accuracy of the grinding spindle is less than 50 nm, the vibration amplitude of the grinding disc is less than 50 nm, and the grinding paste is diamond grinding paste; the grinding disc is a phosphorous cast iron grinding disc with a rotation speed of 0.1-300,000 revolutions/s and using an air-floating spindle; the thickness of the grinding surface damage layer is not less than 50 nm;

In Step (3), in the plasma etching, the etching gas is composed of oxygen, hydrogen and hydrogen fluoride gas, with a volume ratio of 1:0.1-100:0.1-100; the energy source is direct current glow plasma, the etching gas pressure is 0.1-100 kPa, the etching time is 30 s-120 min, and the etching depth is 50-100 nm.

According to some preferred aspects of the present disclosure, the preparation method further comprises a repair step performed after Step (3), and the repair step is plasma chemical vapor deposition and/or plasma etching, and in the plasma chemical vapor deposition, the deposition gas is composed of methane, hydrogen and argon with a volume ratio of 1:(0.1-200):(0.1-100); the deposition pressure is 0.1-100 kPa, the deposition time is 1 min-120 min, and the deposition thickness is 0.1-100 nm.

According to some specific aspects of the present disclosure, the obtained diamond has the following characteristics:

The exposed microscopic surface is selected from (111) crystal faces, (100) crystal faces, (110) crystal faces, amorphous crystal faces, and combinations thereof, and the size of the exposed microscopic crystal form is nano level (may be 0.1-1000 nm), micron level (may be 0.1-1000 μm) or millimeter level (may be 0.1-1000 mm);

Its structure is single crystal, nanocrystal, microcrystal, columnar crystal, or a combination of various crystal indefinite laminates, the thickness of the laminates is 0.1 nm-1000 μm, and the number of laminated layers is two, three or more, and the number of layers is not limited:

The carbon content of its $sp^3$ structure is 80-100%.

Another technical solution provided by the present disclosure is, a diamond prepared according to the abovementioned method. The diamond has good toughness, impact resistance and long service life.

Another technical solution provided by the present disclosure is, use of the diamond above-mentioned in the preparation of cutting tools and heat sinks.

Due to the use of the above technical solutions, the present disclosure has the following advantages over the prior art:

The preparation method proposed by the present disclosure comprehensively designs the whole process, especially by processing of the substrate material of the substrate holder in the early stage, the coupling of the plurality of energy sources in the deposition process, and specific post-processing, the preparation of a stable and uniform diamond film is achieved. The diamond film obtained by the method of the present disclosure, especially the diamond thick film, has good toughness, impact resistance and long service life. The method of the present disclosure has low cost, high production efficiency and good stability, and is suitable for large-scale diamond production of high-quality large-area diamond films.

BRIEF DESCRIPTION OF THE DRAWINGS

In FIG. 1, 11—arc cathode; 12—arc anode; 13—microwave feed inlet; 14—laser feed inlet; 15—magnetic mirror coil; 16—first electron cyclotron coil; 17—first deposition area; 18—first deposition chamber;

In FIG. 2, 21—arc torch inlet; 22—equalizing magnetic field coil; 23—second electron cyclotron coil; 24—second deposition area; 25—second deposition chamber;

In FIG. 3, 31—pulse electrode; 32—first hot filament; 33—first coupling coil; 34—deposition substrate holder; 35—third deposition chamber;

In FIG. 4, 41—second coupling coil; 42—second hot filament; 43—high frequency; 44—upper deposition substrate holder; 45—lower deposition substrate holder; 46—fourth deposition chamber.

DETAILED DESCRIPTION OF EXEMPLARY EMBODIMENTS

Figure 1:
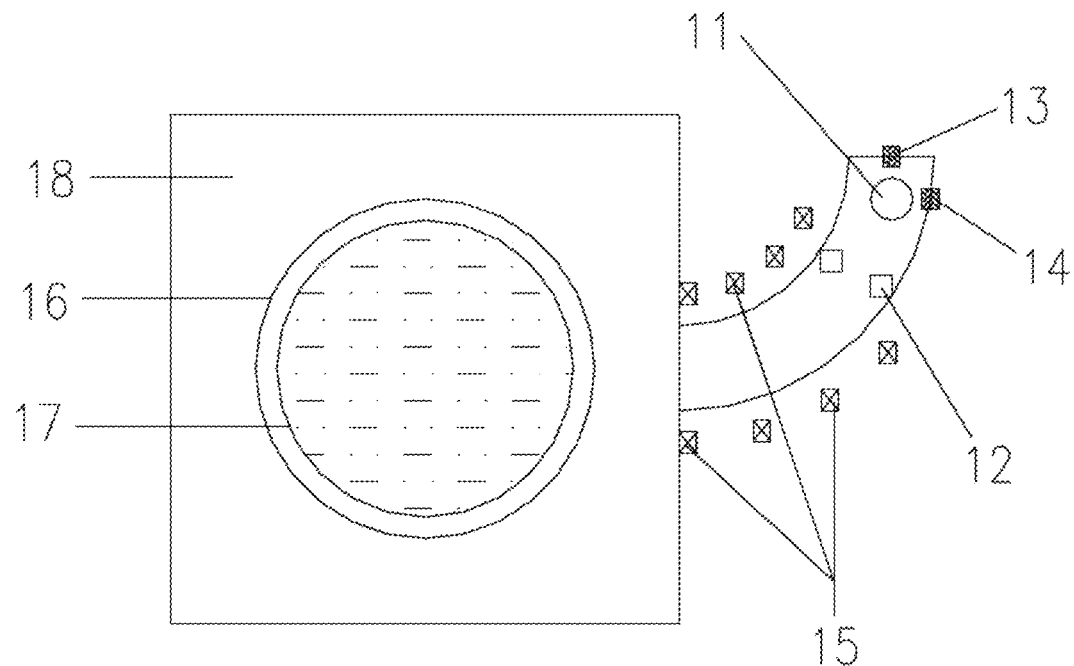
FIGS. 1 to 4 show the designs of the respective energy sources in a plurality of energy source coupling Modes A, B, C, and D in sequence.

Compared with the existing preparation method of chemical vapor deposition diamond film, especially thick film, the improvement mainly lies in:

on the one hand, the fine processing of the substrate holder facilitates the stripping of the diamond, reduces the stress of the diamond, and obtains high-quality diamonds.

Specifically, there are three schemes for processing the substrate material of the substrate holder:

Way I: using a first material as the substrate material, performing surface polished processing, and forming a first nucleation layer on a surface of the substrate material to obtain the substrate holder, the first material being a material that does not react with carbon at the vapor deposition temperature of diamond, and the material of the first nucleation layer is selected from diamond, amorphous carbon, silicon carbide, silicon, germanium, beryllium, and combinations thereof;

Way II: using a second material as a substrate material, performing surface polished processing, and forming a second nucleation layer to obtain the substrate holder, the second material being a material that softens or melts at the vapor deposition temperature of diamond, and the material of the second nucleation layer is selected from carbon, silicon, silicon carbide, silicon nitride, and combinations thereof;

Way III: processing the surface of the substrate material and forming a loose layer and a third nucleation layer thereon in sequence to serve as a substrate holder, the material of the loose layer is selected from the group consisting of amorphous carbon, amorphous silicon, diamond micro-powder, silica micro-powder, aluminum oxide micro-powder, and combinations thereof, the material of the third nucleation layer is selected from diamond, amorphous carbon, silicon carbide, silicon, germanium, beryllium, and combinations thereof.

The substrate holders processed or prepared according to the above three schemes are not only very conducive to the growth of the diamond film, but also easy to separate from the diamond film after the diamond film is formed in the later stage, ensuring that a diamond with complete and large area is obtained.

The present disclosure further obtains plasma that is most conducive to diamond formation through the coupling of a plurality of energy sources, obtaining high-quality diamonds with higher efficiency, and reducing energy consumption while improving diamond preparation efficiency.

Further, (1) high energy density coupling in the diamond growth area

Limited by the melting point of tungsten, the power limit of the magnetron, and the temperature limit of the arc torch tip, etc., the energy density of a single hot filament, microwave, and arc torch is limited to 500 W per square millimeter or less, and through the coupling of a plurality of energy sources, the energy density can be significantly increased, for example, the use of a regular pentagonal cavity structure to design a microwave resonant cavity, can increase the energy density of microwave plasma by five times; the coupling of hot filament and electric arc process can increase the energy density by more than two times. The coupling of multiple energy sources is not a single energy superposition. Because diamond is deposited from a low-temperature non-equilibrium plasma, and the electron temperature is much higher than the ion temperature, the purpose of coupling a plurality of energy sources is to use more energy to generate effective excitation ionization, and increase the number and proportion of the deposited diamond $CH_2$ groups (since the ionized ion energy is not the higher the better, the generation and recombination of free ions requires specific energy level transitions and frequencies and free paths, the coupling of a plurality of energy sources of the present disclosure can fit the feed-in energy with the characteristic spectrum, frequency, and free path of the plasma, to generate resonance or excitation, and promote effective excitation ionization, while the simple superposition of a plurality of energy sources is an ineffective superposition, which only generates excess light and heat, causes excess heat transfer and special requirements for materials and equipment structure, but is not beneficial to the energy density of the diamond production area). It increases the effective energy consumption at the same power by 20-30 times; that is, at the same power, the deposition speed of the same quality diamond is 20-30 times that of a single energy source.

(2) highly uniform energy source coupling in the diamond growth area

The hot filament is a linear energy source, the microwave is a spherical energy source, the arc torch is a point-like energy source, and the suitable areas for diamond growth are a tubular area 3-5 mm from the hot filament, and a spherical shell area 3-5 mm from the standing microwave, and a tube cone-shaped area 3-5 mm from the arc edge. A single energy source can only form a very small confined diamond deposition growth area, and through the coupling of a plurality of energy sources, a specific uniform area can be stretched, and the plasma area for effective diamond growth can be stretched by 5-100 mm:

(3) high-energy ions that are unfavorable to diamond growth are shielded outside of the diamond growth area through coupling or the high-energy ions are controlled in the diamond growth area to be as few as possible through coupling.

The core areas of plasmas of hot filament, microwave, and electric arc have large amounts of high-energy plasmas, especially ions with energy higher than 5 keV. These ions are useless for diamond deposition but can graphitize the diamond that has been prepared and reduce the quality of the diamond. Through coupling with magnetic resonance, the plasma energy can be balanced to the greatest extent and high-energy ions can be effectively reduced; by applying magnetic confinement, more than 99.9%, further, more than 99.99%, and still further, more than 99.999% of high-energy ions (50 keV) are shielded from the diamond deposition area.

See FIG. 1, a way of coupling a plurality of energy sources (Mode A) is showed. Various energy sources comprise cathode arc, electron cyclotron resonance, and optional microwaves and lasers. A voltage is applied between an arc cathode 11 and an arc anode 12, and the voltage is not enough to be in a discharge state, and microwave and laser are fed through a microwave inlet 13 and a laser inlet 14 respectively, or only one of them is fed, through their excitation, the plasma arc ignition is generated, so that a smooth discharge is generated between the arc anode 12 and the arc cathode 11 and the discharge continues steadily. Using laser or microwave or both for excitation can avoid a large number of large particle ions flying out at the moment of high voltage discharge. The cathode is a high-purity carbon target. The generated plasma removes large particles and high-energy ions through the magnetic confinement effect of a magnetic mirror coil 15, and at the same time, under the condition of the electron cyclotron magnetic field formed by a first electron cyclotron coil 16, only hydrogen ions and carbon ions suitable for diamond growth reach a first deposition area 17 of a first deposition chamber 18, thereby obtaining high-quality diamonds.

Figure 2:
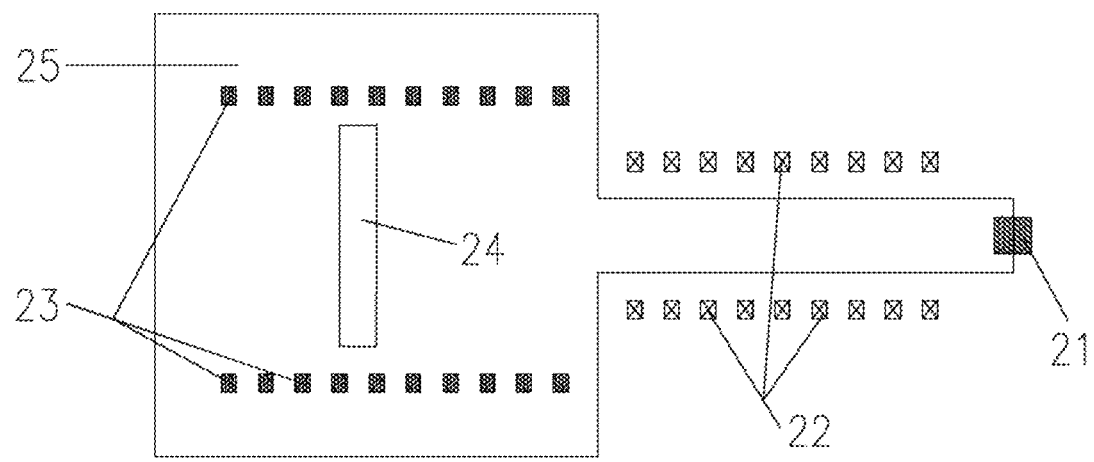

See FIG. 2, another way of coupling a plurality of energy sources (Mode B) is showed. The employed plurality of energy sources comprises arc torch, magnetic resonance and electron cyclotron resonance. After the arc torch is ejected from the arc torch mouth, it enters the cavity from an arc torch inlet 21 and uses an equalizing magnetic field coil 22 to apply a primary magnetic resonance (equalizing magnetic field) to force the center temperature and high-energy ions of the arc torch to deflect and collide with the ions on the edge of the arc torch to generate exchange. The temperature gradient is reduced from 2000-4000 degrees Celsius/mm at the arc torch outlet to 400-500 degrees Celsius/mm, and further homogenizes under the condition of the electron cyclotron magnetic field formed by a second electron cyclotron coil 23 to charge the central ion by collision, and through the control of distance and magnetic field, the temperature gradient at the position of 10-15 mm from the mouth of the arc torch is further reduced from 400-500 degrees Celsius/mm to 40-50 degrees Celsius/mm, and at the same time, high-energy particles greater than 5 keV are deflected by a magnetic field and collide and couple to reduce to less than 5 keV. Through the coupling design, without changing the overall energy density of the plasma, the energy of the plasma in a second deposition area 24 in a second deposition chamber 25 is equalized, and by controlling the frequency and size of the precisely coupled magnetic field, the proportion of ions producing diamond is oriented to increase.

Figure 3:
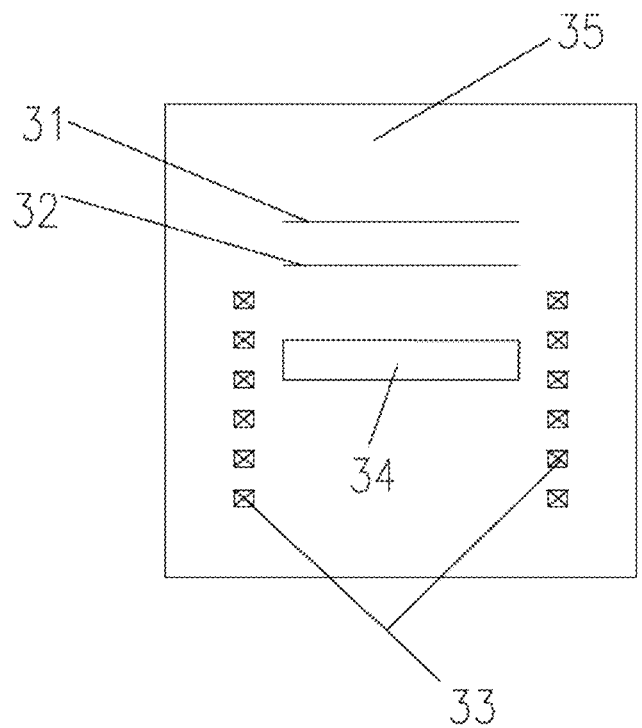

See FIG. 3, still a way of coupling a plurality of energy sources (Mode C) is showed. The employed plurality of energy sources is magnetic resonance (specifically, magnetic cyclotron resonance), hot filament and direct current. A pulse electrode 31, that is, a pulsed direct current bias power source, is applied between a first hot filament 32 and a deposition substrate holder 34, and a first coupling coil 33 is used to apply a magnetic cyclotron resonance magnetic field around the deposition substrate holder 34. By controlling the size and changing direction of the magnetic field, the density and uniformity of plasma on the surface of the deposition substrate holder 34 in a third deposition chamber 35 are increased.

Figure 4:
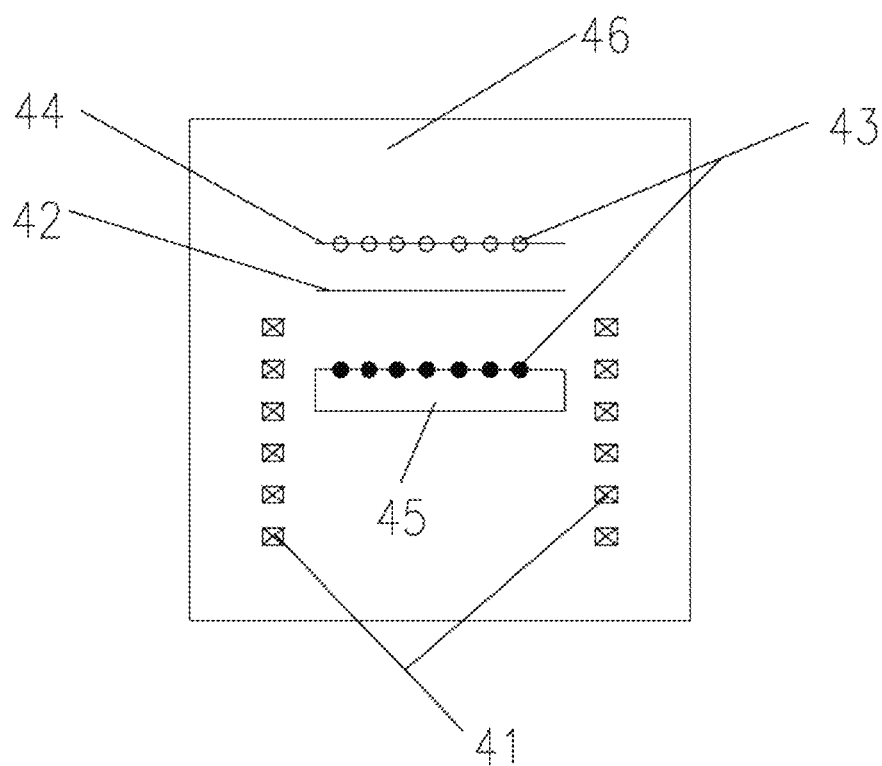

See FIG. 4, yet a way of coupling a plurality of energy sources (Mode D) is showed. The employed plurality of energy sources is magnetic resonance (specifically, magnetic cyclotron resonance), hot filament and high frequency. An upper deposition substrate holder 44 and a lower deposition substrate table 45 are respectively arranged on two parallel sides of a second hot wire 42 to produce diamonds. High frequency 43 is used to generate a high frequency discharge between the two substrate holders. A magnetic cyclotron resonance magnetic field is applied around the lower deposition substrate holder 45 using a second coupling coil 41. By controlling the size and changing direction of the magnetic field, the density and uniformity of plasma on the surface of the substrate holder are increased.

Through the post-processing process of the diamond free-standing thick film, the present disclosure further improves the toughness and impact resistance of the diamond and improves the service life of the diamond.

On the basis of the above process improvement, it can also be combined with the relatively mature intelligent control technology, and the multi-mode closed-loop control technology may be used in the vapor deposition process of diamond, to realize the balance control of the key environment, conditions and temperature field of the deposition, reduce manual operation error, and improve the quality and stability of production.

The method of the present disclosure is also applicable to the production processes of plasma chemical vapor deposition thin film coated cutting tools, single crystal diamond, polycrystalline optical-grade diamond, etc., and can also be expected to obtain the desired effect.

The high-quality diamond self-supporting thick film prepared by the method of the present disclosure is expected to greatly reduce the preparation cost of diamond thick film cutting tools, and improve processing quality, and it can also be applied to the field of heat sinks.

In the following, the specific embodiments are combined to further explain the above solutions in detail; it should be understood that, those embodiments are to explain the basic principle, major features and advantages of the present disclosure, and the present disclosure is not limited by the scope of the following embodiments; the implementation conditions employed by the embodiments may be further adjusted according to particular requirements, and undefined implementation conditions usually are conditions in conventional experiments. If no special instructions are given in the following embodiments, all raw materials are commercially available or prepared by conventional methods in the field.

Embodiment 1

This embodiment provides a method for preparing diamond, which can prepare a self-supporting diamond thick film (with a thickness of 2 mm), and comprises the following steps in sequence.

(1) Processing of the Substrate Holder

The processing of the substrate holder was carried out according to Way III of the present disclosure, and comprised the following steps in sequence:
  (i) a titanium substrate (with a thickness of 6 mm) was taken and polished to obtain a nano-level surface (with surface finish <5 nm);
  (ii) a loose layer (with a thickness of 5 μm) was formed on the surface of the titanium substrate, and the process was: depositing the loose carbon film on the titanium surface by vapor deposition, and in the deposition process, the power was 5 kW, the deposition time was 20 min, and the gas was high-purity methane;
  (i) magnetron sputtering was used to form a nucleation layer (with a thickness of 200 nm, and a nucleation density about $1.5 \times 10^{13}$ per $cm^2$) on the aforementioned loose layer, and the specific conditions and process were: pulsed direct current magnetron sputtering, the sputtering power was 300 W, the target material was high-purity silicon, the sputtering time was 5 min, the nucleation process gas volume ratio was methane:hydrogen=5:100, the nucleation time was 20 min, and the nucleation pressure was 6 kPa.

(2) Preparation of Diamond Film by Multi-Energy Sources Coupled Plasma Chemical Vapor Deposition In this embodiment, the diamond film layer was the coupling of five energy sources, namely electric arc, electron cyclotron resonance, magnetic resonance, laser and microwave, and the specific coupling mode was the aforementioned Mode A, the plasma density in the diamond deposition growth area was controlled to be $1 \times 10^{10}$ per $cm^3$;

The deposition gas was a mixture of an etching gas, a diamond carbon source gas and an assisted deposition or doping gas, and a volume ratio of the etching gas, diamond carbon source gas, and assisted deposition or doping gas was 1:100:69; the etching gas was hydrogen gas (with a purity not less than 99.9999%), the diamond carbon source gas was methane (with a purity not less than 99.9999%), and the assisted deposition or doping gas was argon (with a purity not less than 99.9999%).

The temperature of the substrate holder was controlled to 900° C., the deposition pressure was controlled to 5 kPa, and the diamond deposition speed was controlled to 8 μm/h.

In this step, the preparation method further comprised a photoelectric self-feedback control system that controls the deposition temperature, deposition voltage, deposition current, deposition power, deposition gas pressure, and deposition gas flow during the deposition process, the photoelectric self-feedback control system comprised a temperature measurement and control system, a voltage self-feedback control system, a current self-feedback control system, a power self-feedback control system, and an emission spectrum self-feedback control system, the temperature can be controlled by the cooling water flow and the temperature of the cooling water, and through the control of the photoelectric self-feedback control system, the deposition temperature deviation was not higher than 0.5° C., the deposition voltage deviation was not higher than 0.5 V, the deposition current deviation was not higher than 0.5 A, the deposition power deviation was not higher than 10 W, the deposition gas pressure deviation was not higher than 50 Pa, and the deposition gas flow deviation was not higher than 0.5 sccm;

(3) Post-Processing

The post-processing comprised the following steps in sequence:

Chemical treatment: sulfuric acid (96%) and hydrogen peroxide (30%) were used for etching; the etching time was 10 min, the temperature was 160 degrees, and graphite and substrate residues were removed;

Plasma etching: the etching gas was composed of oxygen, hydrogen and hydrogen fluoride gas, with a volume ratio of 1:1:0.5; the energy excitation source was direct current glow plasma, the etching gas pressure was 0.2 kPa, the etching time was 20 min, and the etching depth was 0.5 μm; silicon and the nucleation were removed.

Cutting: laser cutting was used, the wavelength of the laser was 193 nm, the laser power was 2 kW, the repetition rate was 60%, and the surface roughness after cutting was 3 μm;

Grinding and polishing: mechanical grinding, the gyration accuracy of the spindle was less than 50 nm, the vibration amplitude of the grinding disc was less than 50 nm, and the grinding paste was diamond grinding paste; the grinding disc was a phosphorous cast iron grinding disc with a rotation speed of 160,000 revolutions/s and using an air-floating spindle; the thickness of the grinding surface damage layer was not less than 50 nm;

(4) Repair

Plasma chemical vapor deposition: the deposition gas was composed of methane, hydrogen and argon with a volume ratio of 1:100:60; the deposition pressure was 2 kPa, and the deposition time was 3 h; the deposition thickness was 6 μm.

Figure 5:
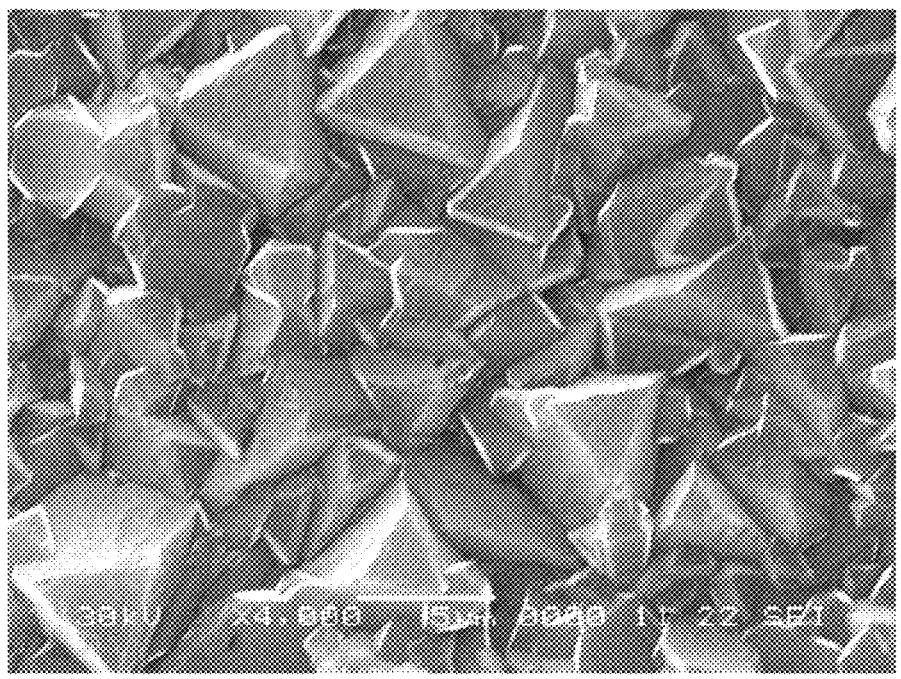
FIG. 5 is an SEM image of the diamond made in Embodiment 1 of the present disclosure.

The exposed microcrystalline surface of the prepared diamond was (111), and the exposed microcrystalline size was micron level; the structure was columnar crystals, and the carbon content of the $sp^3$ structure in the diamond was 85% (testing method was XPS), SEM image is shown in FIG. 5, the measured internal stress was 120 MPa (the test method was Raman spectroscopy), and the hardness was 95 GPa.

Embodiment 2

This embodiment provides a method for preparing diamond, which can prepare a self-supporting diamond thick film (with a thickness of 2 mm), and comprises the following steps in sequence.

(1) Processing of the Substrate Holder

The processing of the substrate holder was carried out according to Way I of the present disclosure, and comprised the following steps in sequence:
  (i) a high-purity copper (with a thickness of 6 mm) was taken and polished to obtain a nano-level surface (with surface finish <5 nm);
  (ii) magnetron sputtering was used to form a nucleation layer (with a thickness of 200 nm, and a nucleation density about $1.5 \times 10^{13}$ per $cm^2$) on the copper surface, and the specific conditions and process were: pulsed direct current magnetron sputtering, the sputtering power was 300 W, the target material was high-purity silicon, the sputtering time was 5 min, the nucleation process gas volume ratio was methane:hydrogen=5: 100, the nucleation time was 20 min, and the nucleation pressure was 6 kPa.

(2) Preparation of Diamond Film by Multi-Energy Sources Coupled Plasma Chemical Vapor Deposition In this embodiment, the coupling mode of the plurality of energy sources was the aforementioned Mode B, that is, the coupling of arc torch, electron cyclotron resonance and magnetic resonance. The mouth of the arc torch was controlled at 15 mm through the coupling of the three energy sources, the temperature gradient from the torch core to the torch edge was about 40 degrees Celsius/mm, the ion energy in the diamond deposition growth area was balanced, and the plasma density was $10 \times 10^{10}$ per $cm^3$.

The deposition gas was a mixture of an etching gas, a diamond carbon source gas and an assisted deposition or doping gas, and a volume ratio of the etching gas, diamond carbon source gas, and assisted deposition or doping gas was 1:100:69; the etching gas was hydrogen gas (with a purity not less than 99.9999%), the diamond carbon source gas was methane (with a purity not less than 99.9999%), and the assisted deposition or doping gas was argon (with a purity not less than 99.9999%).

The temperature of the substrate holder was controlled to 1200° C., the deposition pressure was controlled to 5 kPa, and the diamond deposition speed was controlled to 20 μm/h;

In this step, the preparation method further comprised a photoelectric self-feedback control system that controls the deposition temperature, deposition voltage, deposition current, deposition power, deposition gas pressure, and deposition gas flow during the deposition process, the photoelectric self-feedback control system comprised a temperature measurement and control system, a voltage self-feedback control system, a current self-feedback control system, a power self-feedback control system, and an emission spectrum self-feedback control system, the temperature can be controlled by the cooling water flow and the temperature of the cooling water, and through the control of the photoelectric self-feedback control system, the deposition temperature deviation was not higher than 0.5° C., the deposition voltage deviation was not higher than 0.5 V, the deposition current deviation was not higher than 0.5 A, the deposition power deviation was not higher than 10 W, the deposition gas pressure deviation was not higher than 50 PA, and the deposition gas flow deviation was not higher than 0.5 sccm;

(3) Post-Processing

The post-processing comprised the following steps in sequence:

Chemical treatment: sulfuric acid (96%) and hydrogen peroxide (30%) were mixed at a mass ratio of 1:1 and then used for etching; the etching time was 10 min, the temperature was 160 degrees, and graphite and substrate residues were removed;

Plasma etching: the etching gas was composed of oxygen, hydrogen and hydrogen fluoride gas, with a volume ratio of 1:1:0.5; the energy excitation source was direct current glow plasma, the etching gas pressure was 0.2 kPa, the etching time was 20 mm, and the etching depth was 0.5 un; silicon and the nucleation were removed.

Cutting: the cutting was laser cutting, the wavelength of the laser was 193 nm, the laser power was 2 kW, the repetition rate was 60%, and the surface roughness after cutting was 3 μm;

Grinding and polishing: mechanical grinding, the gyration accuracy of the spindle was less than 50 in, the vibration amplitude of the grinding disc was less than 50 nm, and the grinding paste was diamond grinding paste; the grinding disc was a phosphorous cast iron grinding disc with a rotation speed of 160,000 revolutions/s and using an air-floating spindle; the thickness of the grinding surface damage layer was not less than 50 nm.

(4) Repair

Plasma chemical vapor deposition: the deposition gas was composed of methane, hydrogen and argon with a volume ratio of 1:100:60; the deposition pressure was 2 kPa, and the deposition time was 3 h; the deposition thickness was 6 μm.

Figure 6:
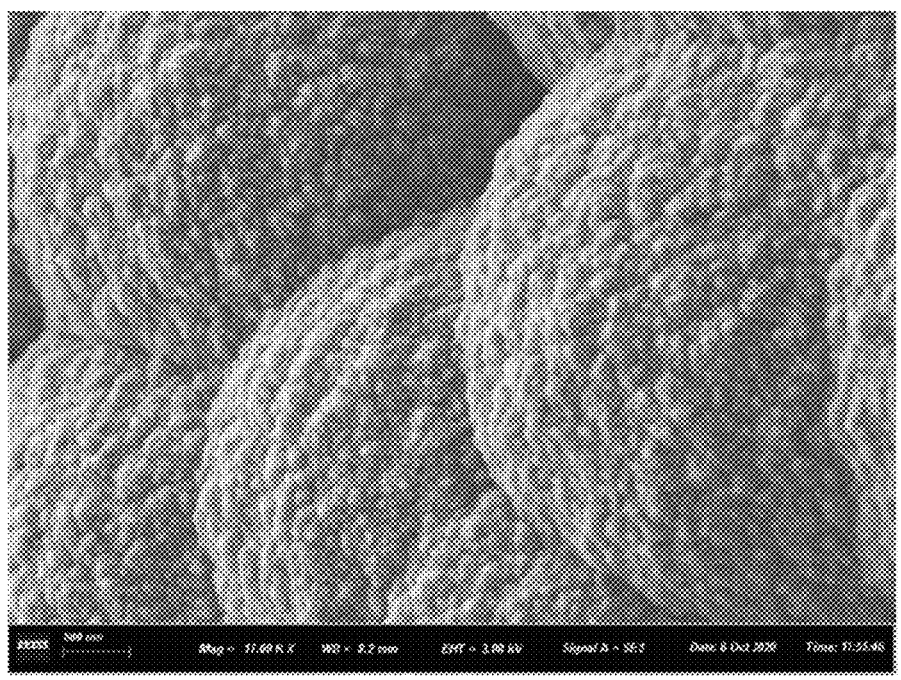
FIG. 6 is an SEM image of the diamond made in Embodiment 2 of the present disclosure.

The exposed microcrystalline surface of the prepared diamond was amorphous, and the exposed microcrystalline size was nano level; the structure was equiaxial crystal, and the carbon content of the $sp^3$ structure in the diamond was 80% (testing method was XPS), SEM image of the diamond is shown in FIG. 6, the measured internal stress was 90 MPa, and the hardness was 80 GPa.

Embodiment 3

This embodiment provides a method for preparing diamond, which can prepare a self-supporting diamond thick film (with a thickness of 2.0 mm), and comprises the following steps in sequence.

(1) Processing of the Substrate Holder

The processing of the substrate holder was carried out according to Way II of the present disclosure, and comprised the following steps in sequence:

(i) an aluminum substrate (with a thickness of 6 mm) was taken and polished to obtain a nano-level surface (with surface finish <5 nm);

(ii) magnetron sputtering was used to form a nucleation layer (with a thickness of 5 nm, and a nucleation density about $1.5 \times 10^{13}$ per $cm^2$) on the aluminum substrate surface, and the specific conditions and process were: pulsed direct current magnetron sputtering, the sputtering power was 400 W, the target material was high-purity silicon, the sputtering time was 25 min. the nucleation process gas volume ratio was methane: hydrogen=5:100, the nucleation time was 20 min, and the nucleation pressure was 6 kPa.

(2) Preparation of Diamond Film by Multi-Energy Sources Coupled Plasma Chemical Vapor Deposition In this embodiment, the coupling mode of the plurality of energy sources was the aforementioned Mode C. Through the coupling of the three energy sources, the growth range of diamond was extended from 3-5 mm the hot filament to 5-100 mm from the hot filament, and the plasma density was $3-10^{10}$ per $cm^3$; the ion energy in the diamond deposition growth area was balanced.

The deposition gas was a mixture of an etching gas, a diamond carbon source gas and an assisted deposition or doping gas, and a volume ratio of the etching gas, diamond carbon source gas, and assisted deposition or doping gas was 1:100:69; the etching gas was hydrogen gas (with a purity not less than 99.9999%), the diamond carbon source gas was methane (with a purity not less than 99.9999%), and the assisted deposition or doping gas was argon (with a purity not less than 99.9999%).

The temperature of the substrate holder was controlled to 800° C., the deposition pressure was controlled to 4 kPa, and the diamond deposition speed was controlled to 4 μm/h;

In this step, the preparation method further comprised a photoelectric self-feedback control system that controls the deposition temperature, deposition voltage, deposition current, deposition power, deposition gas pressure, and deposition gas flow during the deposition process, the photoelectric self-feedback control system comprised a temperature measurement and control system, a voltage self-feedback control system, a current self-feedback control system, a power self-feedback control system, and an emission spectrum self-feedback control system, the temperature can be controlled by the cooling water flow and the temperature of the cooling water, and through the control of the photoelectric self-feedback control system, the deposition temperature deviation was not higher than 0.5° C., the deposition voltage deviation was not higher than 0.5 V, the deposition current deviation was not higher than 0.5 A, the deposition power deviation was not higher than 10 W, the deposition gas pressure deviation was not higher than 50 PA, and the deposition gas flow deviation was not higher than 0.5 sccm;

(3) Post-Processing

The post-processing comprised the following steps in sequence:

Chemical treatment: sulfuric acid (96%) and hydrogen peroxide (30%) were mixed at a mass ratio of 1:1 and then used for etching; the etching time was 10 min, the temperature was 160 degrees, and graphite and substrate residues were removed;

Plasma etching: the etching gas was composed of oxygen, hydrogen and hydrogen fluoride gas, with a volume ratio of 1:1:0.5; the energy excitation source was direct current glow plasma, the etching gas pressure was 0.2 kPa, the etching time was 20 min, and the etching depth was 0.5 μm; silicon and the nucleation were removed.

Cutting: the cutting was laser cutting, the wavelength of the laser was 193 nm, the laser power was 2 kW, the repetition rate was 60%, and the surface roughness after cutting was 3 μm:

Grinding and polishing: mechanical grinding, the gyration accuracy of the spindle was less than 50 nm, the vibration amplitude of the grinding disc was less than 50 nm, and the grinding paste was diamond grinding paste; the grinding disc was a phosphorous cast iron grinding disc with a rotation speed of 160,000 revolutions/s and using an air-floating spindle; the thickness of the grinding surface damage layer was not less than 50 nm.

(4) Repair

Plasma chemical vapor deposition: the deposition gas was composed of methane, hydrogen and argon with a volume ratio of 1:100:60; the deposition pressure was 2 kPa, and the deposition time was 3 h; the deposition thickness was 6 μm.

Figure 7:
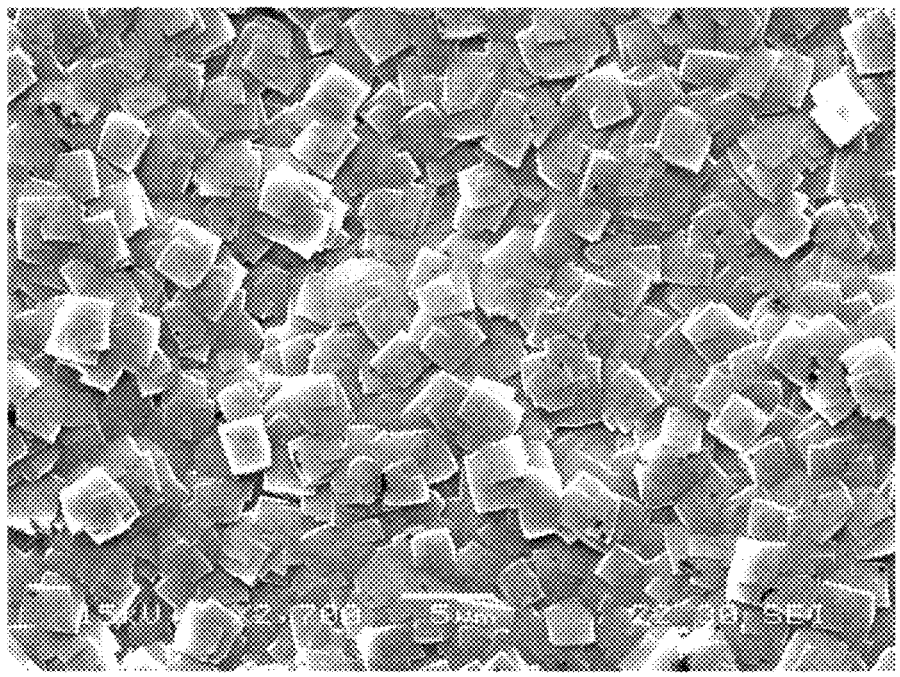
FIG. 7 is an SEM image of the diamond made in Embodiment 3 of the present disclosure.

The exposed microcrystalline surface of the prepared diamond was (100), and the exposed microcrystalline size was micron level; the structure was columnar crystal, and the carbon content of the $sp^3$ structure in the diamond was 80% (testing method was XPS), SEM image of the diamond is shown in FIG. 7, the measured internal stress was 50 MPa, and the hardness was 90 GPa.

Embodiment 4

This embodiment provides a method for preparing diamond, which can prepare a self-supporting diamond thick film (with a thickness of 1.5 mm), and comprises the following steps in sequence.

(1) Processing of the Substrate Holder

The processing of the substrate holder was carried out according to Way III of the present disclosure, and comprised the following steps in sequence:
(i) a titanium substrate (with a thickness of 6 mm) was taken and polished to obtain a nano-level surface (with surface finish <5 nm);
(ii) a loose layer (with a thickness of 5 μm) was formed on the surface of the titanium substrate, and the process was: depositing the loose carbon film on the titanium surface by vapor deposition, and in the deposition process, the power was 5 kW, the deposition time was 20 min, and the gas was high-purity methane;
(iii) magnetron sputtering was used to form a nucleation layer (with a thickness of 200 nm, and a nucleation density about $1.5 \times 10^{13}$ per $cm^2$) on the aforementioned loose layer, and the specific conditions and process were: pulsed direct current magnetron sputtering, the sputtering power was 300 W, the target material was high-purity silicon, the sputtering time was 5 min, the nucleation process gas volume ratio was methane: hydrogen=5:100, the nucleation time was 20 min, and the nucleation pressure was 6 kPa.

(2) Preparation of Diamond Film by Multi-Energy Sources Coupled Plasma Chemical Vapor Deposition The coupling mode of the plurality of energy sources used in this embodiment, was the aforementioned Mode D. Through the coupling of the three energy sources, the growth range of diamond was extended from 3-5 mm from the hot filament to 5-100 mm from the hot filament, and the plasma density was $3\text{-}10^{10}$ per $cm^3$;

The deposition gas was a mixture of an etching gas, a diamond carbon source gas and an assisted deposition or doping gas, and a volume ratio of the etching gas, diamond carbon source gas, and assisted deposition or doping gas was 1:100:69; the etching gas was hydrogen gas (with a purity not less than 99.9999%), the diamond carbon source gas was methane (with a purity not less than 99.9999%), and the assisted deposition or doping gas was argon (with a purity not less than 99.9999%):

The temperature of the substrate holder was controlled to 800° C., the deposition pressure was controlled to 4 kPa, and the diamond deposition speed was controlled to 4 μm/h;

In this step, the preparation method further comprised a photoelectric self-feedback control system that controls the deposition temperature, deposition voltage, deposition current, deposition power, deposition gas pressure, and deposition gas flow during the deposition process, the photoelectric self-feedback control system comprised a temperature measurement and control system, a voltage self-feedback control system, a current self-feedback control system, a power self-feedback control system, and an emission spectrum self-feedback control system, the temperature can be controlled by the cooling water flow and the temperature of the cooling water, and through the control of the photoelectric self-feedback control system, the deposition temperature deviation was not higher than 0.5° C., the deposition voltage deviation was not higher than 0.5 V, the deposition current deviation was not higher than 0.5 A, the deposition power deviation was not higher than 10 W, the deposition gas pressure deviation was not higher than 50 PA, and the deposition gas flow deviation was not higher than 0.5 sccm;

(3) Post-Processing

The post-processing comprised the following steps in sequence:

Chemical treatment: sulfuric acid (96%) and hydrogen peroxide (30%) were mixed at a mass ratio of 1:1 and then used for etching; the etching time was 10 min, the temperature was 160 degrees, and graphite and substrate residues were removed:

Plasma etching: the etching gas was composed of oxygen, hydrogen and hydrogen fluoride gas, with a volume ratio of 1:1:0.5; the energy excitation source was direct current glow plasma, the etching gas pressure was 0.2 kPa, the etching time was 20 min, and the etching depth was 0.5 µm; silicon and the nucleation were removed.

Cutting: the cutting was laser cutting, the wavelength of the laser was 193 nm, the laser power was 2 k W, the repetition rate was 60%, and the surface roughness after cutting was 3 µm;

Grinding and polishing: mechanical grinding, the gyration accuracy of the spindle was less than 50 nm, the vibration amplitude of the grinding disc was less than 50 nm, and the grinding paste was diamond grinding paste; the grinding disc was a phosphorous cast iron grinding disc with a rotation speed of 160,000 revolutions/s and using an air-floating spindle; the thickness of the grinding surface damage layer was not less than 50 nm.

(4) Repair

Plasma chemical vapor deposition: the deposition gas was composed of methane, hydrogen and argon with a volume ratio of 1:100:60; the deposition pressure was 2 kPa, and the deposition time was 3 h; the deposition thickness was 6 µm.

Figure 8:
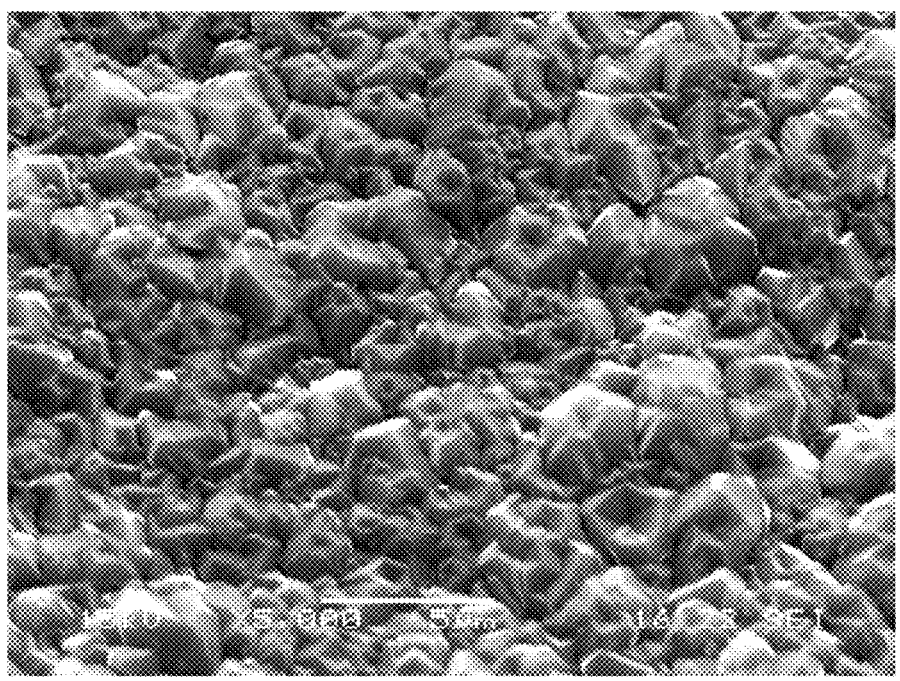
FIG. 8 is an SEM image of the diamond made in Embodiment 4 of the present disclosure.

The exposed microcrystalline surface of the prepared diamond was twin crystal (111), and the exposed microcrystalline size was micron level; the structure was columnar crystal, and the carbon content of the $sp^3$ structure in the diamond was 80% (testing method was XPS). SEM image of the diamond is shown in FIG. 8, the measured internal stress was 150 MPa, and the hardness was 95 GPa.

Comparison 1

It is basically the same as Embodiment 1, differing only in that the titanium substrate was directly used as a substrate holder after being polished. The diamond thick film cannot be separated from the substrate, and the preparation of the self-supporting thick film failed.

Comparison 2

It is basically the same as Embodiment 1, differing only in that, in Step (2), when preparing the diamond film, only the coupling of arc torch and magnetic resonance was used.

The prepared diamond film had poor surface uniformity, being thick in the middle while thin in the edges, and large internal stress. Two situations are prone to occur. First, the temperature gradient was too large, the thermal stress was large, and the diamond thick film was broken. 2. In the post-processing process, the diamond thick film was cracked and broken during cutting and processing.

Comparison 3

It is basically the same as Embodiment 1, differing only in that, in Step (2), when preparing the diamond film, only the coupling of hot filament and high frequency was used.

The diamond was of poor quality and contained high sp2 structure, and the growth rate of diamond was slow, and under the same conditions, the thickness of the preparation was 0.9 mm and the growth rate was about 1 µm/h.

Comparison 4

It is basically the same as Embodiment 1, differing only in that, processes in Step (3) and Step (4) were not carried out.

The fracture toughness of the nucleation surface of diamond was very different from that of the growth surface, and the fracture toughness of the growth surface was about 800 MPa, and the fracture toughness of the nucleation surface was 1.1 GPa.

The embodiments described above are only for illustrating the technical concepts and features of the present disclosure, and are intended to make those skilled in the art being able to understand the present disclosure and thereby implement it, and should not be concluded to limit the protective scope of this disclosure. Any equivalent variations or modifications according to the spirit of the present disclosure should be covered by the protective scope of the present disclosure.

The endpoints and any values of the ranges disclosed herein are not limited to the precise ranges or values, and these ranges or values should be understood to include values close to these ranges or values. For ranges of value, between the end values of each range, between the end values of each range and individual point values, and between individual point values can be combined with each other to obtain one or more new ranges of value, and these ranges of value should be considered as specifically disclosed herein.

We claim:

1. A method for preparing diamond, comprising the following steps in sequence:
   (1) processing a substrate material of a substrate holder to obtain a surface that is separated from diamond films, wherein the substrate material of the substrate holder is processed in any of the following ways:
   Way I: using a first material as the substrate material, performing surface polished processing, and forming a first nucleation layer on a surface of the substrate material to obtain the substrate holder, the first material being a material that does not react with carbon at the vapor deposition temperature of diamond, and the material of the first nucleation layer is selected from diamond, amorphous carbon, silicon carbide, silicon, germanium, beryllium, and combinations thereof;
   Way II: using a second material as the substrate material, performing surface polished processing, and forming a second nucleation layer to obtain the substrate holder, the second material being a material that softens or melts at the vapor deposition temperature of diamond, and the material of the second nucleation layer is selected from carbon, silicon, silicon carbide, silicon nitride, and combinations thereof;
   Way III: processing the surface of the substrate material and forming a loose layer and a third nucleation layer thereon in sequence to serve as the substrate holder, a material of the loose layer is selected from amorphous carbon, amorphous silicon, diamond micro-powder, silica micro-powder, aluminum oxide micro-powder, and combinations thereof; a material of the third nucleation layer is selected from diamond, amorphous carbon, silicon carbide, silicon, germanium, beryllium, and combinations thereof;
   (2) using a plasma chemical vapor deposition method to form a diamond film layer on the surface of the substrate holder, wherein the plasma chemical vapor deposition method uses a multi-energy sources coupled plasma, and the plurality of energy sources are 2, 3, or more kinds;
   (3) post-processing the diamond film layer to remove impurity material on the diamond surface and a nucleation layer and/or stress layer with inconsistent properties of a main body of the diamond film.

2. The method for preparing diamond according to claim 1, in Way I, the first material is selected from copper, copper alloy, silicon carbide, aluminum oxide, silicon dioxide, microcrystalline glass ceramics, and combinations thereof;

and/or, in Way II, the second material is selected from mercury, plumbum, tin, aluminum, sodium, alloys thereof, and combinations thereof; and/or, in Way III, the substrate material is selected from materials that react with diamond at the vapor deposition temperature of diamond, the first material, the second material, and combinations thereof.

3. The method for preparing diamond according to claim 1, in Way III, the substrate material is selected from iron, iron alloys, nickel, nickel alloys, titanium, tungsten, molybdenum, alloys thereof, and combinations thereof.

4. The method for preparing diamond according to claim 1, in Way I, the first nucleation layer has a thickness of 5 nm-5 µm, and a nucleation density not lower than $1.0 \times 10^{13}$ per $cm^2$;

in Way II, the second nucleation layer has a thickness of 200 nm-5 µm, and a nucleation density not lower than $1.0 \times 10^{13}$ per $cm^2$;

in Way III, the loose layer has a thickness of 0.01 nm-1000 µm, and the third nucleation layer has a thickness of 0.1 nm-100 µm, and a nucleation density not lower than $1 \times 10^{13}$ per $cm^2$.

5. The method for preparing diamond according to claim 1, wherein the loose layer is prepared by using chemical vapor deposition, thermal deposition, spin coating, or Czochralski process, and the first nucleation layer, the second nucleation layer, and the third nucleation layer are respectively formed using a chemical vapor deposition method.

6. The method for preparing diamond according to claim 1, in Step (1), the surface of the substrate holder is a nano-level plane, a micron-level plane or a millimeter-level plane.

7. The method for preparing diamond according to claim 1, in Step (2), in the plasma chemical vapor deposition, the temperature of the substrate holder is from room temperature to 1200° C., the deposition gas pressure is 0.01 to 200 kPa, and the speed of depositing diamond is 0.01-200 µm/h; in the plasma chemical vapor deposition, the deposition gas is a mixture of an etching gas, a diamond carbon source gas, and an assisted deposition or doping gas.

8. The method for preparing diamond according to claim 7, in Step (2), the etching gas is selected from hydrogen, ammonia, fluorine, hydrogen fluoride, hydrogen chloride, and combinations thereof, the diamond carbon source gas is selected from methane, acetone, acetylene, and combinations thereof, the assisted deposition or doping gas is selected from nitrogen, argon, xenon, borane, silane, phosphorane, and combinations thereof, and the purity of each gas in the deposition gas is not less than 99.9999%.

9. The method for preparing diamond according to claim 1, in Step (2), the energy sources are selected from magnetic resonance, electric arc, hot filament, flame, microwave, radio frequency, high frequency, direct current, laser, ion beam, electron beam, electron cyclotron resonance, and also meet the following (i) or (ii):
(i) the plurality of energy sources comprises at least magnetic resonance, and the energy of the plasma in a diamond deposition area is equalized through a coupling of the plurality of energy sources;
(ii) the plurality of energy sources does not comprise magnetic resonance, when performing the plasma chemical vapor deposition, a magnetic confinement is applied to shield more than 99.9% of energy ions above 5 keV from the diamond deposition area;
through the coupling of the plurality of energy sources, a plasma density in the diamond deposition area is controlled to be $0.1 \times 10^{10}$ per $cm^3$-$100 \times 10^{10}$ per $cm^3$.

10. The method for preparing diamond according to claim 9, wherein the electric arc is a cathode arc or an arc torch, and the coupling of the plurality of energy sources adopts one of the following coupling modes:
Mode A: the coupling of the plurality of energy sources is the coupling of one or both of laser and microwave, cathode arc and electron cyclotron resonance;
Mode B: the coupling of the plurality of energy sources is the coupling of arc torch, magnetic resonance and electron cyclotron resonance;
Mode C: the coupling of the plurality of energy sources is the coupling of magnetic resonance, hot filament and direct current;
Mode D: the coupling of the plurality of energy sources is the coupling of magnetic resonance, hot filament and high frequency;
wherein, at the time Mode A is adopted, the magnetic confinement is applied.

11. The method for preparing diamond according to claim 10, in Mode A, the laser and/or microwave are first coupled with the cathode arc to smoothly initiate a cathode arc sustainably and stably generate the cathode arc, and after the generated plasma excited by the cathode arc passes through the magnetic confinement to shield high-energy ions, it couples with the electron cyclotron resonance plasma; in Mode B, the plasma generated by the arc torch is coupled with the magnetic resonance plasma and the electron cyclotron resonance plasma successively, and through the coupling, at a position of 10-15 mm from an arc torch mouth, a temperature gradient from a torch core to a torch edge is 40 to 50 degrees Celsius/mm; in Mode C, a hardness of the obtained diamond film reaches 80-100 Gpa when a diamond deposition rate reaches 40-50 µm/h through coupling.

12. The method for preparing diamond according to claim 1, in Step (2), a environment or conditions of chemical vapor deposition are balance controlled, and the environment or conditions are one or more of deposition temperature, deposition voltage, deposition current, deposition power, deposition gas pressure, and deposition gas flow; in Step (2), it is optional to control a temperature gradient and an energy transfer direction of the temperature field in an diamond deposition area to control the deposition of diamond.

13. The method for preparing diamond according to claim 12, when a photoelectric self-feedback control system is used to perform the balance control, the photoelectric self-feedback control system comprises a temperature measurement and control system, a voltage self-feedback control system, a current self-feedback control system, a power self-feedback control system, and an emission spectrum self-feedback control system, and through the control of the photoelectric self-feedback control system, a deposition temperature deviation is not higher than 0.5° C., a deposition voltage deviation is not higher than 0.5 V, a deposition current deviation is not higher than 0.5 A, a deposition power deviation is not higher than 10 W, a deposition gas pressure deviation is not higher than 50 PA, and a deposition gas flow deviation is not higher than 0.5 sccm.

14. The method for preparing diamond according to claim 1, in Step (3), the post-processing comprises chemical processing, plasma etching, cutting, grinding and polishing carried out in sequence, or cutting, grinding and polishing carried out in sequence.

15. The method for preparing diamond according to claim 14, in Step (3), the chemical processing is processing with an organic acid and/or an inorganic acid, or a combination thereof with hydrogen peroxide;

in Step (3), the cutting is laser cutting, the laser has a wavelength of 100-1100 nm, a laser power of 0.1-100 KW, and a repetition rate of 0.1-99.9%, and a surface roughness after cutting is 0.1 nm-100 μm;

in Step (3), the grinding and polishing is mechanical grinding;

in Step (3), in the plasma etching, the etching gas is composed of oxygen, hydrogen and hydrogen fluoride gas, with a volume ratio of 1:0.1-100:0.1-100; the energy source is direct current glow plasma, an etching gas pressure is 0.1-100 kPa, an etching time is 30 s-120 min, and an etching depth is 50-100 nm.

16. The method for preparing diamond according to claim 15, wherein the preparation method further comprises a repair step performed after Step (3), and the repair step is plasma chemical vapor deposition and/or plasma etching, and in the plasma chemical vapor deposition, the deposition gas is composed of methane, hydrogen and argon with a volume ratio of 1:(0.1-200):(0.1-100); the deposition pressure is 0.1-100 kPa, and the deposition time is 1 min-120 min; the deposition thickness is 0.1-100 nm.

17. The method for preparing diamond according to claim 1, wherein the obtained diamond prepared by method has the following characteristics:

an exposed microscopic surface is selected from (111) crystal faces, (100) crystal faces, (110) crystal faces, amorphous crystal faces, and combinations thereof, and a size of the exposed microscopic crystal forms is nano level, micron level or millimeter level;

its structure is single crystal, nanocrystal, microcrystal, columnar crystal, or a combination of various crystal indefinite laminates, the thickness of the laminates is 0.1 nm-1000 μm, and the number of laminated layers is two, three or more; the carbon content of the $sp^3$ structure is 80-100%.

* * * * *